United States Patent
Kengeri (10) Patent No.: US 6,459,647 B1
(45) Date of Patent: Oct. 1, 2002

(54) SPLIT-BANK ARCHITECTURE FOR HIGH PERFORMANCE SDRAMS

(75) Inventor: Subramani Kengeri, Cupertino, CA (US)

(73) Assignee: Alliance Semiconductor, Santa Clara, CA (US)

( * ) Notice: Subject to any disclaimer, the term of this patent is extended or adjusted under 35 U.S.C. 154(b) by 0 days.

(21) Appl. No.: 09/778,380

(22) Filed: Feb. 6, 2001

Related U.S. Application Data (60) Provisional application No. 60/181,075, filed on Feb. 8, 2000.

(51) Int. Cl.[7] .................................................. G11C 8/00
(52) U.S. Cl. .................................... 365/230.03; 365/194
(58) Field of Search .......................... 365/230.03, 233, 365/194; 710/100; 711/5; 713/503

(56) References Cited

U.S. PATENT DOCUMENTS

| | | | | |
|---|---|---|---|---|
| 6,122,688 A | * | 9/2000 | Barth et al. ................. | 710/100 |
| 6,173,356 B1 | * | 1/2001 | Rao ............................... | 711/5 |
| 6,226,757 B1 | * | 5/2001 | Ware et al. ................. | 713/503 |
| 6,310,817 B1 | * | 10/2001 | Kablanian .............. | 365/230.03 |

* cited by examiner

*Primary Examiner*—Trong Phan
(74) *Attorney, Agent, or Firm*—Beyer Weaver & Thomas LLP (57) ABSTRACT

Apparatus, methods, and systems are disclosed for providing a memory device, such as a SDRAM, having distributed memory bank segments logically coupled to form a virtual memory bank. Each of the memory bank segments are proximally positioned relative to associated I/Os. In this way, the delay times from each of the memory bank segments to their respective I/Os are substantially equal to each other. In addition, the proximal positioning of the memory banks results in reduced signal delays due to reduced signal paths from each bank segment and respective I/O.

4 Claims, 6 Drawing Sheets

SPLIT-BANK ARCHITECTURE FOR HIGH PERFORMANCE SDRAMS

CROSS-REFERENCE TO A RELATED APPLICATION

This application takes priority under 35 U.S.C. §119(e) of U.S. Provisional Patent Application No. 60/181,075 filed Feb. 8, 2000, naming Subramani Kengeri as inventor, and assigned to the assignee of the present application which is also incorporated herein by reference in its entirety for all purposes.

BACKGROUND OF THE INVENTION

1. Field of the Invention

The invention relates to semiconductors and more particularly to memory devices such as Synchronous Dynamic Random Access Memory devices having distributed segmented memory banks.

2. Discussion of Related Art

Conventional Dynamic Random Access Memory (DRAM), of the type that has been used in PCs since the original IBM PC, is said to be asynchronous. This refers to the fact that the operation of the memory is not synchronized to the system clock but depends entirely on the timing inherent in the memory device regardless of the frequency of the system clock.

Figure 1:
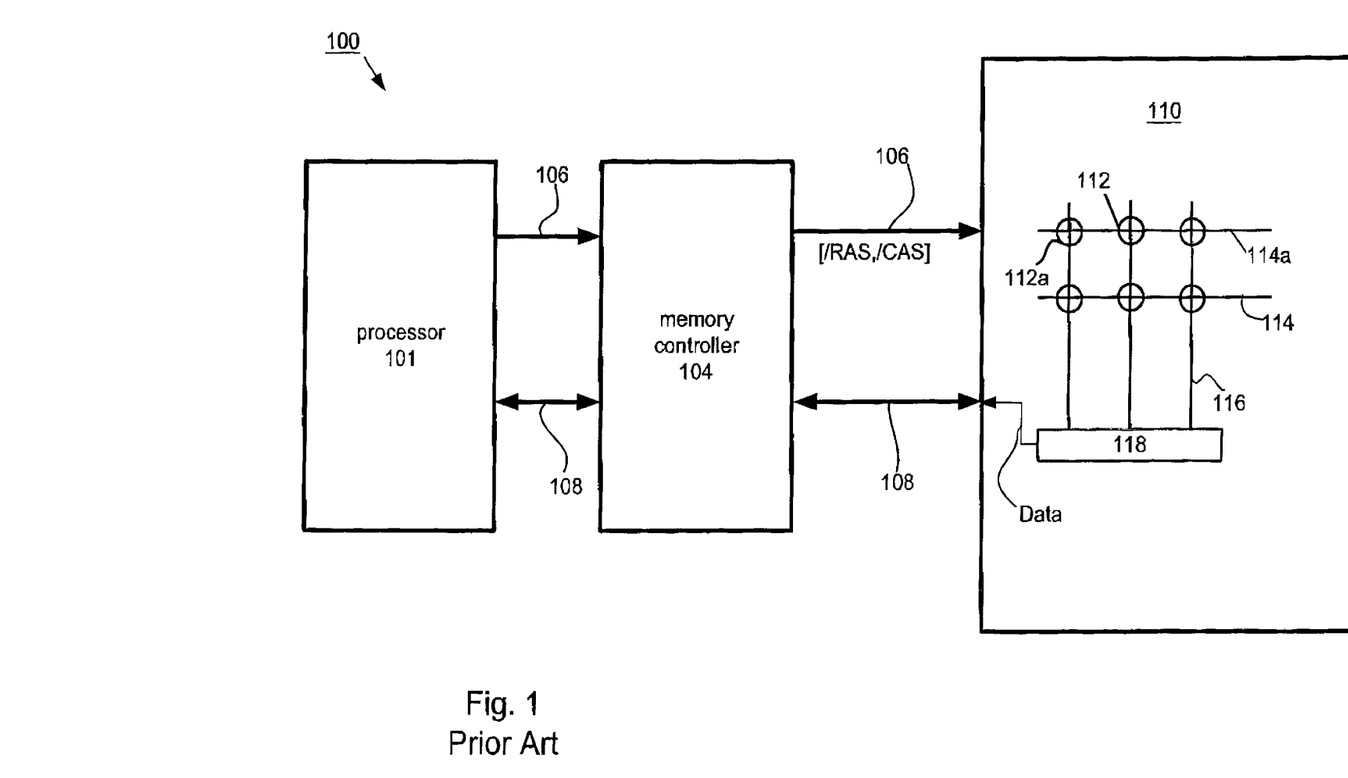
FIG. 1 is a block diagram of a conventional memory system that includes a prior art memory device.

For example, referring to FIG. 1, a system 100 has a processor 101 that is coupled to a memory controller 104 by way of an address bus 106 and a bi-directional data bus 108. The memory controller 102 is, in turn, coupled to an asynchronous type memory device 110 by way of both the address bus 106 and the data bus 108. In order to access the memory device 110 in what is referred to as either a READ or a WRITE operation, a specific procedure must be followed. Typically, the processor 101 generates a specific memory address request (also referred to as a memory page request) corresponding to the location in the memory device 110 where data (or memory page) required by the processor 101 is stored. The memory address request is passed to the memory controller 104 by way of the address bus 106.

In conventional memory systems, the memory controller 104 generates the appropriate memory access signals that are decoded by the memory device 110 identifying the memory location in the memory device 110 where the requested data is stored. Once accessed, the stored data is output to the data bus 108 to be read by the processor 101 or whatever other device requested it. It should be noted that since the above-described operations are performed asynchronously with regard to the system clock, the processor 101 is usually required to wait for the appropriate data to be made available. These wait states degrade effective processor performance since the processor 101 cannot complete a desired operation without the requisite data from the memory device 110.

More specifically, during, for example, a READ operation, the processor 101 generates an address request corresponding to the memory location in the memory device 110 at which the required data is stored. Since all memory chips hold their contents in a logical "square" of memory cells 112 in the form of rows 114 and columns 116, reading data stored in, for example, the memory cell 112a, requires that first, a row 114a be activated using what is referred to as a "Row Address Select" (or "Row Address Strobe", "/RAS") signal that is provided by the memory controller 104. Specifically, the RAS is a signal sent to a DRAM that tells it that an associated address is a row address.

Typically, the /RAS signal is based upon a "lower half" of the address request provided by the processor 101. When received and properly decoded, the /RAS signal causes the data in the entire row 114a to be transferred to a sense amp 118 after a period of time required for the selected row to stabilize.

Once the selected row has stabilized and the data in the selected row is transferred to the sense amp 118, the memory controller 104 further decodes the address request forming what is referred to as a "Column Address Select" ("/CAS") signal which when sent to a DRAM tells it that an associated address is a column address. The /CAS signal causes column select circuitry (not shown) to select the specific cell (in this case 112a) in the memory array that contains the desired data. The contents of the cell 112a are then sent out to the data bus 108 from the sense amp 118 where the processor 101 or other device that requested the data can read it. It should be noted that the data bus 108 is a bi-directional data bus since during a WRITE operation, the processor 101 provides data to be stored in the memory device 110.

Figure 2:
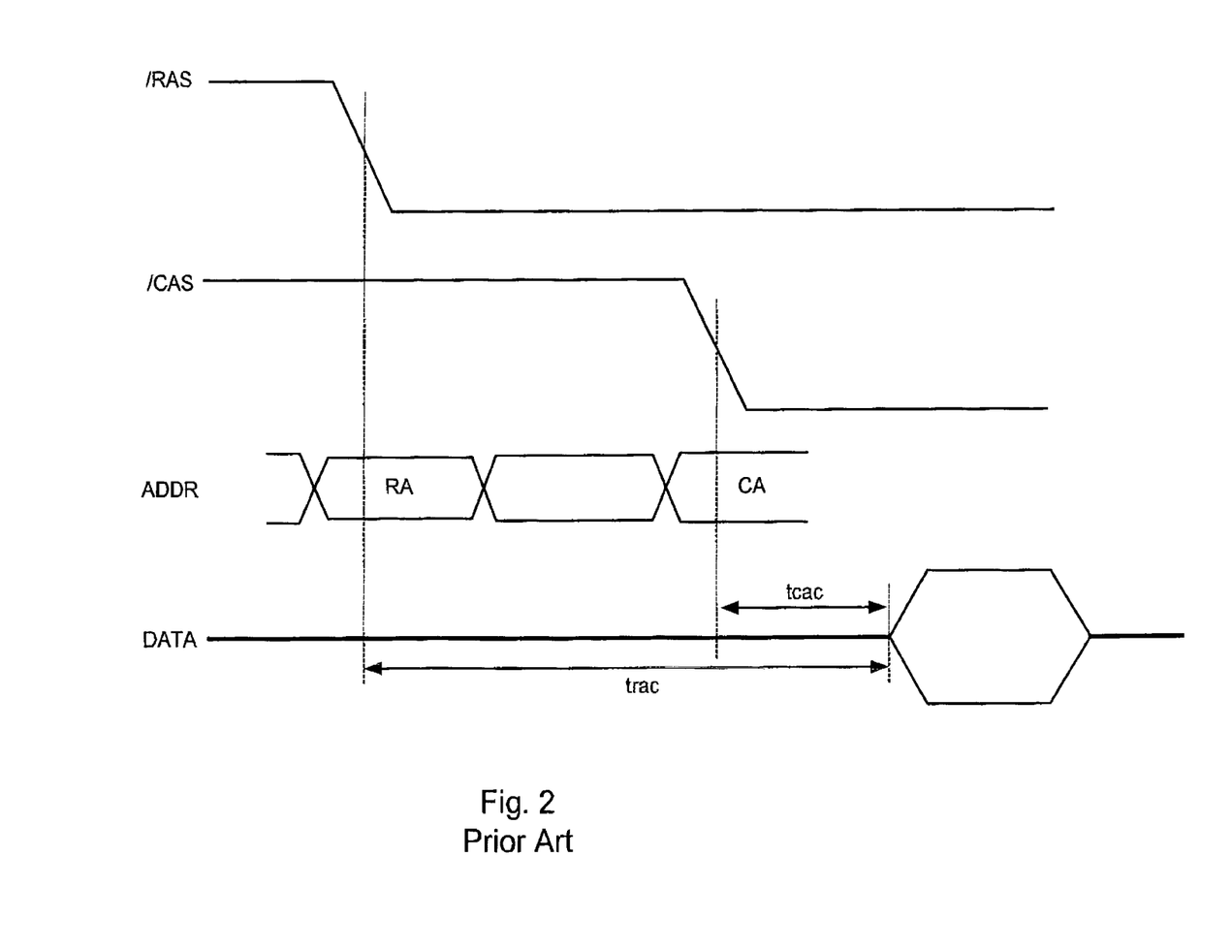
FIG. 2 is a typical timing diagram associated with the prior art memory device shown in FIG. 1 in the form of a conventional DRAM.

FIG. 2 is a timing diagram 200 illustrating the above-described READ operation. The performance of the memory device 110 is based upon several critical timing paths that includes the duration of time between the acquisition of data at the data bus 108 and the falling edge of the /RAS signal (referred to as access time from /RAS, or $t_{rac}$). Another critical timing path is referred to as access time to column address $t_{cac}$ is defined as the duration of time from the falling edge /CAS to the data out to data bus 110. Any, and all, of these delays, also referred to as memory latency, degrades system performance since the speed of the DRAM is directly related to the slowest critical path.

Usually, the worst case latency in any DRAM is specified by the row access time $t_{RAC}$ that is itself composed of several components, at least two of which are directly related to data line length (and therefore chip size and bit density) and the associated capacitive loading coupled thereto (referred to as RC delay). One such component is referred to as bit line sensing latency which is defined as the time for the data stored in a memory cell to be detected by the corresponding sense amp. This bit line sensing latency is affected by many factors, including bit line architecture, the RC of the sense amp drive line, cell-to-bit line capacitance ratio, as well as sense amp topology. Another component which substantially contributes to overall memory latency is referred to as output driving latency. Output driving latency is defined as the time required for the data to be propagated from the sense amp to the output node (again an RC-type delay).

Conventional attempts to reduce $t_{RAC}$ generally strive to reduce these two components by way of various circuit and layout techniques. In the case of bit line sensing latency, since the cell-to-bit line capacitance ratio directly impacts the bit line sensing delay, by increasing this ratio reduces the bit line sensing latency (by providing a higher memory cell drive current). Typically, this approach is practiced by either increasing memory cell capacitance (by increasing cell size) or by putting fewer memory cells on a single bit line. Unfortunately, however, both of these approaches increase overall cell area or reduce cell density resulting in larger chips with lower bit density with a concomitant increase in cost.

Fortunately, even with these circuit delays, the asynchronous DRAM memory device 110 works well in lower speed memory bus systems, it is not nearly as suitable for use in high-speed (>66 MHz) memory systems since each READ operation and WRITE operation can not be any faster than the memory latency which is typically on the order of 5–7 clock cycles. In order to service these high-speed systems, therefore, a relatively new and different kind of RAM, referred to as Synchronous DRAM, or SDRAM, has been developed. The SDRAM differs from earlier types of DRAM in that it is tied to the system clock and therefore does not run asynchronously as do standard DRAMs. Since SDRAM is tied to the system clock and is designed to be able to READ or WRITE from memory in what is referred to as a burst mode (after the initial READ or WRITE latency) at 1 clock cycle per access (zero wait states), the SDRAM is able to operate at bus speeds up to 100 MHz or even higher. By running at the system clock, no wait states are typically required (after initial set up) by the processor resulting in the higher system speeds.

SDRAM accomplishes its faster access using a number of internal performance improvements that include a "burst mode" capability, which allows the SDRAM to transfer multiple cells without cycling the /CAS line thereby limiting the CAS latency to the first few clock cycles of the burst read. This operation is what makes SDRAM "faster" than conventional DRAM even though the actual internal operations are essentially the same. By way of example, a 4 cycle burst READ can be accomplished in 8 clock cycles (5,1,1,1) where "5" represents the initial READ latency of 5 clock cycles, whereas to read the same data, a standard DRAM would require 20 clock cycles (5,5,5,5). Another internal improvement is related to the organization of the SDRAM memory core. Using what is referred to as a multi-bank architecture, the memory cells that constitute the storage elements of the SDRAM are grouped in what is referred to as memory banks each of which is selected (or not) based upon a bank select signal. In this way, while one bank one of the multi-bank SDRAM is outputting data during a READ, for example, another bank is being activated such that there is effectively no latency in accessing any banks after initial startup.

Figure 3:
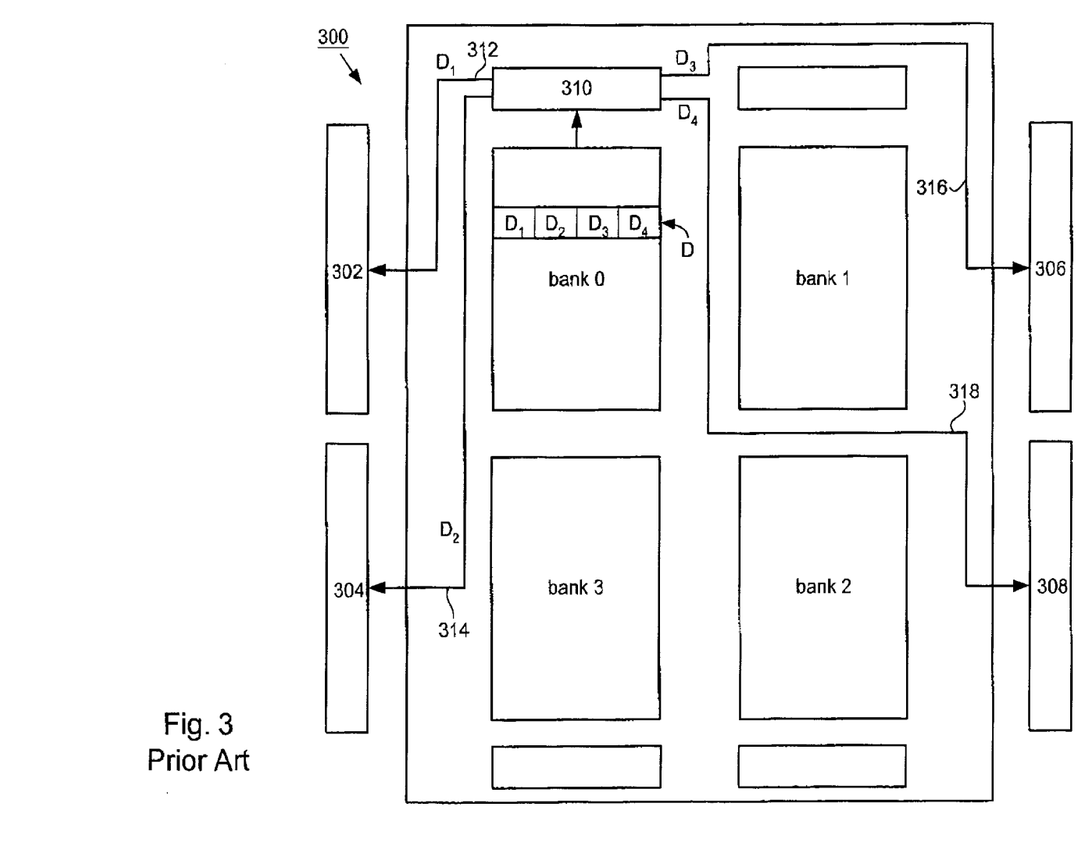
FIG. 3 is a prior art multi-banked SDRAM.

Referring to FIG. 3 showing a prior art multi-bank SDRAM 300. The SDRAM 300 includes a number of memory banks, bank 0, bank 1, bank 2, and bank 3, each of which must be capable of supplying a full data word to each of the I/O's 302, 304, 306, and 308. In the case of, for example, a ×32 architecture, (i.e., the SDRAM 300 is coupled to a 32 bit data bus) each of the memory banks bank 0 through bank 3, when selected, must provide an 8 bit data word to each of the outputs 302–308, for example, during a READ operation, in order for a total of 32 bits to be transferred to at 32 bit data bus.

For example, the bank 0 has stored therein a requested 32 bit data word D the form of 8 bit data words $D_1, D_2, D_3,$ and $D_4$. During an exemplary READ operation, a bank select signal activates the bank 0 and (after appropriately accessing the memory location at which the data word $D_1$ is stored), a sense amp 310 coupled to the bank 0 outputs the data word $D_1$ to the output 302 by way of a data line 312. In a similar manner, after appropriate decoding, the sense amp 310 outputs the data word $D_2$ to the output 304 by way of a data line 314, the data word $D_3$ to the output 306 by way of the data line 316, and the data word $D_4$ by way of the data line 318 to the output 308. In all cases, the period of time between the output of the data word $D_i$ from the sense amp 310 and its receipt at the corresponding output is referred to as output drive delay time $t_i$. For example, the time it takes the data word $D_3$ to travel from the sense amp 310 to the output 308 is referred to as the output drive delay time $t_3$.

Since each of the output drive delay times $t_i$ are directly dependent on line length, it is important that the line lengths of the data lines 312–318 be as short as possible. For example, the output drive delay time $t_4$ will be substantially greater than the output drive delay time $t_1$ simply due to the fact that the length of the data line 318 is substantially greater than that of the data line 312. Since the overall performance of the SDRAM 300 is dictated by the slowest critical path, the longest data line will effectively dictate the overall speed performance of the SDRAM 300. Additionally, the skew between the various outputs 302–308 will be also directly related to the relative output drive delay times $t_i$.

Therefore, what is required is a compact, memory architecture suitable for providing high-speed memory access.

SUMMARY OF THE INVENTION

According to the present invention, methods, apparatus, and systems are disclosed for providing a high performance multi-bank synchronous dynamic random access memory.

In one aspect of the invention, a method of accessing a memory device is described. The memory device includes a plurality of input/outputs (I/Os) coupled to a memory core that stores data in the form of a first data word and a second data word. The memory core includes a first bank segment arranged to store a first portion of the first data word in close proximity to a first one of the I/Os and a second bank segment arranged to store a second portion of the first data work in close proximity to a second one of the I/Os. The second bank segment and the first bank segment are logically coupled to form a first virtual memory bank such that in response to a first bank select signal the first bank segment and the second bank segment respectively output the first bank segment and the second bank segment respectively output the first portion and the second portions of the first data word. By proximally positioning the first and the second bank segments with respect to their associated I/Os, a first signal path from the first bank segment to the first I/O and a second signal path from the second bank segment to the second I/O are substantially equal. In addition, a first delay time between the first bank segment and the first I/O and a second delay time between the second bank segment and the second I/O are substantially equal.

In one embodiment, a computing system is disclosed. The computing system includes a memory device having distributed memory bank segments proximally positioned relative to there associated I/Os thereby substantially equalizing the respective output delay times. The computing system also includes a processor for performing executable instructions stored in the memory device coupled to a memory controller by way of a bi-directional data bus and an address bus.

In another embodiment, a method of accessing requested data from a memory device having a first bank segment and a second bank segment each of which are proximally located from their associated I/Os is provided. As a method a memory address request based upon requested data is generated. A bank select signal is then provided to the memory device based upon the memory address request. The first and the second bank segments are then activated in response to the bank select signal. The request data is transferred in the form of the first portion and the second portion by the first bank segment and the second bank segment respectively such that a first delay time between the first bank segment and the first I/O and a second delay time between the second bank segment and the second I/O are substantially equal.

BRIEF DESCRIPTION OF THE DRAWINGS

The invention will be better understood by reference to the following description taken in conjunction with the accompanying drawings in which.

DETAILED DESCRIPTION OF THE PREFERRED EMBODIMENTS

Reference will now be made in detail to a preferred embodiment of the invention. An example of the preferred embodiment is illustrated in the accompanying drawings. While the invention will be described in conjunction with a preferred embodiment, it will be understood that it is not intended to limit the invention to one preferred embodiment. To the contrary, it is intended to cover alternatives, modifications, and equivalents as may be included within the spirit and scope of the invention as defined by the appended claims.

Synchronous DRAM (SDRAM) is rapidly becoming the new memory standard for modern PCs and other high speed memory systems. The reason is that its synchronized design permits support for the much higher bus speeds that have started to enter the market. As 100 MHz bus systems, such as PCs, become mainstream, SDRAM will largely replace older technologies, such as EDO RAM, since it is designed to work at these higher operating speeds whereas conventional asynchronous DRAM is not.

However, as currently configured, although fast, multi-banked SDRAM architectures introduce unnecessary signal delays that degrade overall system performance due to in part to the unoptimized placement of the various memory banks in relation to the device's outputs. For example, since each bank in a multi-bank system must be capable of supplying a full data word to all outputs (i.e., in a 32 bit system, a single bank must provide at least 32 bits to all outputs coupled to the 32 bit data bus), the signal delay from one memory bank located a greater distance from a particular output will be substantially greater than that from a memory bank that is proximally positioned to the same output.

In addition to the longer delay times, resulting in longer memory access times, signal skew between the various outputs serviced by memory banks located at differing distances from the various outputs requires additional logic in the form of latches in order to prevent race conditions. In some cases, if complex enough, the additional logic has the potential to substantially degrade overall system performance in addition to adding to chip complexity with the increased potential for yield loss.

Broadly speaking, the invention describes a distributed memory architecture useful in fabricating high speed memory devices, such as SDRAMS, for operation in high speed systems, such as personal computers, high speed routers, and the like. By distributing memory bank segments throughout the memory core, each memory bank segment can be placed in proximate position to an associated one of the memory device's output nodes so as to substantially reduce signal delay times. By logically coupling selected memory bank segments so as to be responsive to a particular bank select signal, a virtual memory bank is formed arranged to store a selected data word formed of data word segments stored in the respective bank segments. When a bank select signal is received, only those bank segments responsive to the received bank select signal are activated.

In a preferred embodiment, each of the logically coupled memory bank segments is arranged to store a corresponding portion of the stored data word, which when selected and activated, outputs the stored portion to an associated output node proximally positioned thereto. In this way, the signal delays experienced by each of the memory bank segments during, for example, a READ operation is substantially reduced due, in part, to the reduced data path over which the data signals must pass.

In addition to the reduced signal delays, the signal skew between the various outputs are substantially eliminated since the differences in data paths between the various memory bank segments and the respective outputs are effectively eliminated.

In a preferred embodiment, by asymmetrically aligning selected ones of the distributed memory bank segments, when a particular virtual memory bank (being formed of constituent memory bank segments) is activated, power distribution throughout the memory device is rendered substantially uniform over the active memory core area since the activated virtual memory bank is not localized to a particular region of the memory core.

Figure 4:
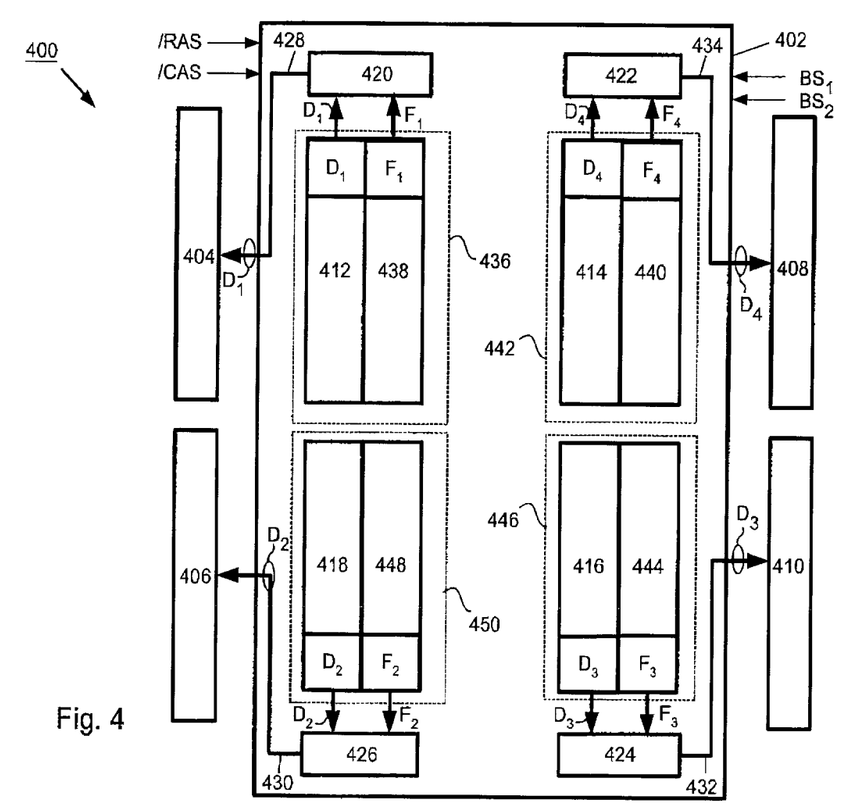
FIG. 4 is a distributed bank SDRAM in accordance with an embodiment of the invention.

Referring now to FIG. 4, a memory device 400 having a distributed memory bank architecture in accordance with an embodiment of the invention is presented. In the described embodiment, the memory device 400 takes the form of a SDRAM but it should be noted that the described architecture can be applied to any type memory device. Accordingly, the SDRAM 400 includes a memory core 402 arranged to respond to incoming input signals supplied by, for example, a processor, by providing appropriate data stored in pre-selected memory locations within the core 402. Input/output (I/0) 404 through 410 are coupled to external circuitry (not shown) and act as conduits for incoming address select and data input signals as well as data output signals. Typically, the data input signals are provided during what is referred to as a WRITE operation wherein the input data is stored at selected locations within the memory core 402.

In the described embodiment, the memory core 402 includes distributed bank segments 412–418 logically coupled to form a virtual memory bank suitably disposed to store a full data word. By fall data word, it is meant a data word of sufficient length as is required by a requesting device. For example, if the requesting device is a 32 bit processor coupled to the memory core 402 by way of a 32 bit data bus, then each of the distributed bank segments 412–418 is arranged to store an 8 bit portion of the 32 bit data word required by the requesting device.

By way of example, in order for the 32 bit processor to retrieve a 32 bit data word D (also referred to as a memory page), the 32 bit processor generates a memory page read request which is decoded by a memory controller (not shown) into appropriate /RAS and /CAS signals. In a preferred embodiment, the memory controller also provides an appropriate Bank Select signal BS which has the effect of activating only the bank segments 412–418 in which the various constituent portions, $D_1$, $D_2$, $D_3$, and $D_4$, of the requested memory page D are respectively stored. In the described embodiment, sense amps 420–426, respectively coupled to the distributed bank segments 412–418, are arranged to read the respective portions $D_1$, $D_2$, $D_3$, and $D_4$, of the requested memory page D. By way of example, the memory page portion $D_1$ is stored in the bank segment 412 at a row location defined by the received /RAS signal and selected by the sense amp 420 based upon the /CAS signal.

Once read, the portion $D_1$ is passed to the I/O 404 by way of a data line 428 that connects the sense amp 420 to the I/O 404. In a similar manner, the sense amp 426 reads the portion $D_2$ and passes it to the I/O 406 by way of a data line 430 that connects the sense amp 426 to the I/O 406, while the sense amp 424 reads the portion $D_3$ and passes it to the I/O 410 by way of a data line 432 that connects the sense amp 424 to the I/O 410. Likewise, the sense amp 422 reads the portion $D_4$ and passes it to the I/O 408 by way of a data line 434 that connects the sense amp 422 to the I/O 408.

It is important to note that since each of the bank segments 412–418 are in substantially equal close proximity to their respective I/O, the data lines 428–434 are of substantially equal lengths. In this way, the delay times associated with each of the data lines 428–434 are substantially equal to each other thereby effectively eliminating problems related to I/O skew.

In addition to the equality of the delay times, by distributing the bank segments 412–418 in such a way as to substantially reduce the lengths of the various data lines, the performance of the memory core 402 is enhanced since the critical timing paths represented by the data lines 428–434 are also reduced.

In a preferred embodiment, the memory core 402 includes a cluster of bank segments 436. The cluster of bank segments 436 includes a bank segment 438 that although in close physical proximity to the bank segment 412, it is nonetheless logically separate and distinct from the bank segment 412. By logically separate and distinct, it is meant that the bank segment 438 is not responsive to the bank select signal $BS_1$ for which the virtual bank formed of the bank segments 412–418 responds. This allows the bank segment 438 to be "precharging" (RAS and CAS activation) while the bank segment 412 is transferring data, and vice versa. Essentially, this substantially eliminates the latency for all accesses after the first one.

By logically coupling the bank segment 438 to other bank segments such as bank segment 440 in a cluster 442, a bank segment 444 in a cluster 446, and a bank segment 448 in a cluster 450, a second virtual memory bank composed of the logically coupled bank segments 438, 440, 444, and 448 can be formed responsive to a second bank select signal $BS_2$. In this way, the memory core 402 can be configured to transfer the data word D from a first virtual memory bank formed of the bank segments 412–418 in response to the first bank select signal $BS_1$ while precharging the second virtual memory bank in preparation for transferring a second data word stored in the bank segments 438, 440, 444, and 448 upon the receipt of a second bank select signal $BS_2$.

For example, when the bank segments 412–418 have completed transferring their respective portions $D_1$, $D_2$, $D_3$, and $D_4$, of the requested memory page D to the I/Os 404–410, the bank segments 438, 440, 444, and 448 have already been pre-charged and are immediately ready to respectively transfer data word portions $F_1$, $F_2$, $F_3$, and $F_4$ corresponding to a data word F (assuming, of course, that the appropriate /RAS and /CAS signals have been received).

It is one of the advantages of the invention that any number of virtual memory banks formed of constituent bank segments (each proximally positioned relative to an associated output) can be configured within the memory core 402 in order to create, for example, a high speed interleaved type memory device. For example, referring to FIG. 5, an interleaved memory core 500 having memory bank segments each being proximally positioned to an associated output in accordance with an embodiment of the invention is shown. It should be noted that the interleaved memory core 500 is but one implementation of the memory core 402. In the described embodiment, the memory core 500 includes M virtual memory banks each having N logically coupled bank segments each represented as $bank_{nm}$. For example, a first memory cluster 502 includes bank segments $bank_{11}$, $bank_{21}$, $bank_{31}$, and $bank_{41}$ each of which is coupled to a sense amp 504. Since each of the bank segments $bank_{11}$, $bank_{21}$, $bank_{31}$, and $bank_{41}$, are identified as belonging to virtual memory banks 1–4, respectively, each are responsive to different bank select signals, $BS_1$, $BS_2$, $BS_3$, and $BS_4$. In this way, the bank segment $bank_{11}$ can transfer data in response to the bank select signal $BS_1$ while the bank segment $bank_{21}$ (belonging to the virtual memory 2) is pre-charging in response to appropriate /RAS and /CAS signals. It should also be noted that each of the bank segments that form a particular virtual memory are in substantially equal close proximity to their respective I/O.

Figure 5:
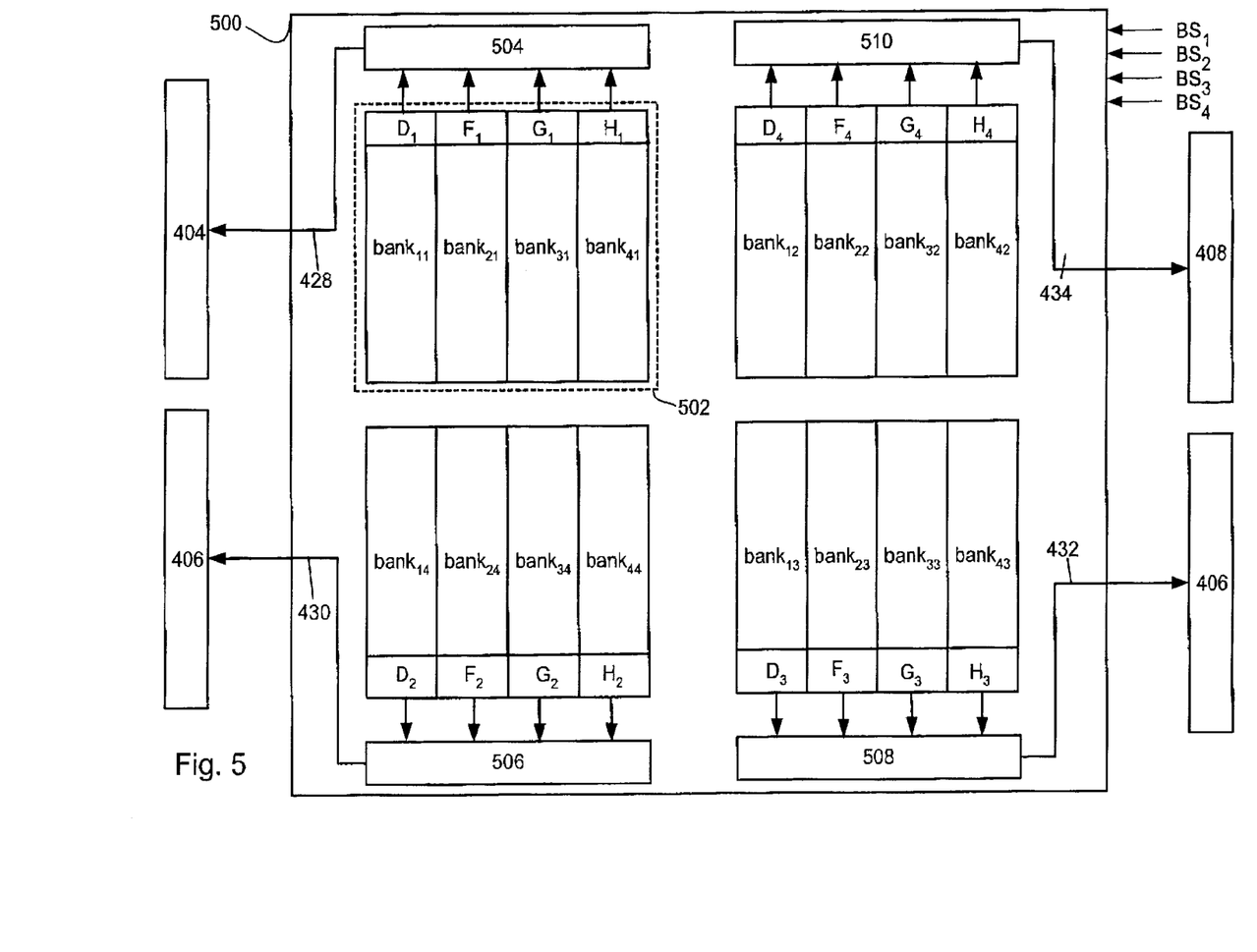
FIG. 5 shows an interleaved memory core having distributed memory bank segments in accordance with an embodiment of the invention.

By interleaving the bank segments included within the various virtual memory banks and placing them substantially equal close proximity to their respective I/O, the performance of the memory core 500 can be substantially enhanced. For example, in one mode of operation, referred to as a burst mode of operation, consecutive data words of memory are read one after the other. The great advantage is that most of the overhead of the first access doesn't have to be repeated for the other three. So instead of those taking 5 to 7 clock cycles, they take only 1 to 3 clock cycles.

When reading or writing four data words, for example, the timing of burst mode access is generally stated using this type of shorthand: "x-y-y-y". The first number ("x") represents the number of clock cycles to do the first READ/WRITE. The other numbers are how many clock cycles to do the second, third and fourth READ/WRITEs. An example would be "5-2-2-2", which means 11 clock cycles to do the whole burst. (Without burst mode this access would take at least 20 clock cycles: "5-5-5-5").

For example, using the memory core 500 in a burst read mode the data words D, F, G, and H each being respectively stored in virtual memories 1, 2, 3, and 4 can be read using an access timing of, for example, 5,1,1,1 (total of 11 clock cycles). For example, during the time that the bank segments $bank_{11}$, $bank_{12}$, $bank_{13}$, and $bank_{14}$ in the virtual memory 1 are transferring their respective data word portions $D_1$, $D_2$, $D_3$, and $D_4$ to the sense amps 504, 506, 508, and 510, respectively, in response to the bank select signal $BS_1$, the bank segments $bank_{21}$, $bank_{22}$, $bank_{23}$, and $bank_{24}$ (that form the virtual memory bank 2) are precharging in preparation for transferring their respective data word portions $F_1$, $F_2$, $F_3$, and $F_4$ corresponding to a data word F in response to the bank select signal $BS_2$. The data words G and H can be transferred in similar manner by interleaving the transferring of data and pre-charging.

In addition to efficiently reading and writing data into and out of the memory device, the inventive distributed multi-bank architecture lends itself to reducing power spikes during the activation of the various memory banks. By distributing the bank segments that constitute the various virtual memories included in the memory core in such a way that no localization of power occurs (as does the conventional localized architectures) the probability of power spiking is substantially reduced.

In some cases it may be desirable to place certain bank segments of a virtual memory bank closer to a central portion of the memory core in order to more evenly distribute dissipated power. By more evenly distributing power, the possibility of localized power spikes and resulting localized heat build up is substantially reduced. For example, referring back to FIG. 5, the memory core 500 having selected bank segments of a virtual memory centrally located in accordance with an embodiment of the invention is shown. In this way, when for example the virtual memory bank formed of the bank segments $bank_{11}$, $bank_{12}$, $bank_{13}$, and $bank_{14}$ is activated, the power spread more evenly over the entire area of the memory core 500.

Figure 6:
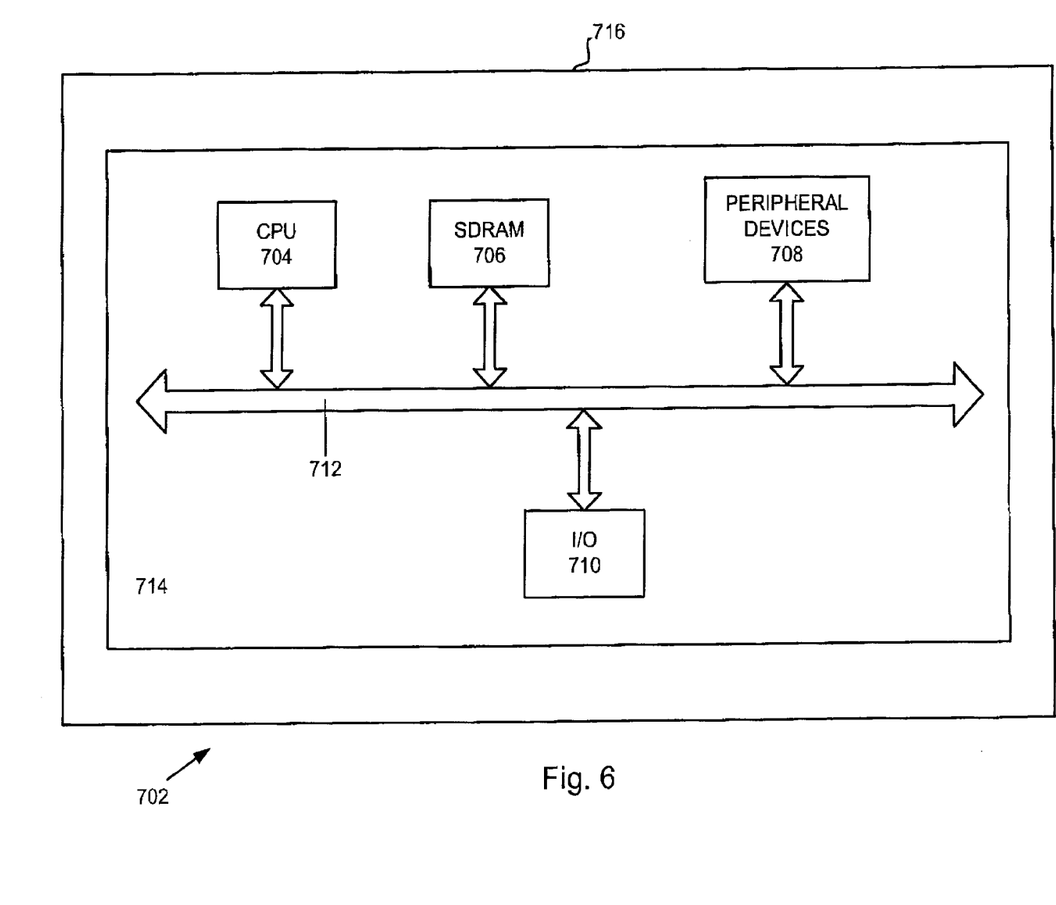
FIG. 6 illustrates one general application of the SDRAM of the present invention as part of a data processing system.

FIG. 6 illustrates one general application of the SDRAM of the present invention as part of a data processing system 702. The data processing system 702 may include one or more of the following components: a processor 704; an SDRAM 706 as memory; I/O circuitry 708; and peripheral devices 710. These components are coupled together by a system bus 712 and are populated on a circuit board 714 that is contained in an end-user system 716.

The system 702 can be used in a wide variety of applications, such as computer networking, data networking, instrumentation, video processing, digital processing, or any other application where the advantage of using a high speed memory device is desirable. The SDRAM 706 can be used to perform a variety of different memory functions. For example, SDRAM 706 can be used to store executable instructions that works in cooperation with processor 704. The SDRAM 706 may also be used to store data used by the processor 704 in such applications as data processing, digital image manipulation programs, and the like in which fast access to a large amount of data is highly desirable. It should be noted that the system 702 is only exemplary, and that the true scope and spirit of the invention should be indicated by the following claims.

Although the foregoing invention has been described in some detail for purposes of clarity of understanding, it will be apparent that certain changes and modifications may be practiced within the scope of the appended claims.

Furthermore, it should be noted that there are alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. A memory device, comprising:

a plurality of input/outputs (I/Os); and a memory core coupled to the plurality of I/Os arranged to store data as at least a first data word and a second data word, wherein the memory core includes, a first bank segment in close proximity to a first one of the plurality of I/Os, wherein the first bank segment is arranged to store a first portion of the first data word, a second bank segment in close proximity to a second one of the plurality of I/Os wherein the second bank segment is arranged to store a second portion of the first data word, and wherein the second bank segment is logically coupled to the first bank segment to form a first virtual memory bank such that in response to a first bank select signal the first bank segment and the second bank segment respectively output the first portion and the second portions of the first data word, and wherein a first signal path from the first bank segment and the first one of the plurality of I/Os and a second signal path from the second bank segment and the second one of the plurality of I/Os are substantially equal such that a first delay time between the first bank segment and the first one of the plurality of I/Os and a second delay time between the second bank segment and the second one of the plurality of I/Os are substantially equal.

2. A memory device as recited in claim 1, wherein the memory core further includes:

a plurality of memory cells each of which stores a corresponding data bit arranged in rows and columns, wherein the first bank segment is formed of a first group of the memory cells and wherein the second bank segment is formed of a second group of the memory cells.

3. A method of accessing data stored in a memory device that includes a plurality of input/outputs (I/Os) coupled to a memory core that stores the data as a first data word and a second data word wherein the memory core includes a first bank segment and a second bank segment wherein the second bank segment and the first bank segment are logically coupled to form a first virtual memory bank, comprising:

in the first bank segment, storing a first portion of the first data word in close proximity to a first one of the plurality of I/Os;

in the second bank segment, storing a second portion of the first data word in close proximity to a second one of the plurality of I/Os; and outputting the first portion and the second portions of the first data word in response to a first bank select and a second bank select signal, respectively, such that by proximally positioning the first and the second bank segments with respect to their associated I/Os, a first signal path from the first bank segment to the first one of the plurality of I/Os and a second signal path from the second bank segment to the second one of the plurality of I/Os are substantially equal and wherein a first delay time between the first bank segment and the first one of the plurality of I/Os and a second delay time between the second bank segment and the second one of the plurality of I/Os are substantially equal.

4. A computing system, comprising:

a memory device having logically coupled and distributed memory bank segments proximally positioned relative to their associated I/Os so as to substantially equalize a respective output delay time for each memory bank segment;

a processor coupled to the memory device for performing executable instructions stored in the memory device; and a memory controller coupled to the processor by way of a bi-directional data bus and an address bus.

* * * * *